(12) United States Patent
Gill

(10) Patent No.: US 6,801,412 B2
(45) Date of Patent: Oct. 5, 2004

(54) METHOD AND APPARATUS FOR IMPROVED PINNING STRENGTH FOR SELF-PINNED GIANT MAGNETORESISTIVE HEADS

(75) Inventor: Hardayal Singh Gill, Palo Alto, CA (US)

(73) Assignee: International Business Machines Corporation, Armonk, NY (US)

( * ) Notice: Subject to any disclaimer, the term of this patent is extended or adjusted under 35 U.S.C. 154(b) by 168 days.

(21) Appl. No.: 10/126,149

(22) Filed: Apr. 19, 2002

(65) Prior Publication Data

US 2003/0197985 A1 Oct. 23, 2003

(51) Int. Cl.[7] .................................................. G11B 5/39
(52) U.S. Cl. .................................................. 360/324.11
(58) Field of Search .............................. 360/317, 324.1, 360/324.11, 324.12, 324.2

(56) References Cited

U.S. PATENT DOCUMENTS

| | | | |
|---|---|---|---|
| 4,663,607 A | 5/1987 | Kitada et al. ............. 338/32 H |
| 5,583,725 A | 12/1996 | Coffey et al. .......... 360/324.11 |
| 5,627,703 A | 5/1997 | Smith ......................... 360/314 |
| 5,648,885 A | 7/1997 | Nishioka et al. ....... 360/324.12 |
| 5,768,069 A | 6/1998 | Mauri ......................... 360/314 |
| 5,891,586 A | 4/1999 | Hasegawa et al. .......... 428/668 |
| 6,052,263 A | 4/2000 | Gill ........................ 360/324.11 |
| 6,117,569 A | 9/2000 | Lin et al. ..................... 428/692 |
| 6,118,624 A | 9/2000 | Fukuzawa et al. ..... 360/324.12 |
| 6,122,150 A | 9/2000 | Gill ........................ 360/324.11 |
| 6,127,045 A | 10/2000 | Gill ............................. 428/611 |
| 6,127,053 A | 10/2000 | Lin et al. ..................... 428/692 |
| 6,157,523 A | 12/2000 | Kikuchi et al. ........ 360/324.11 |
| 6,168,860 B1 | 1/2001 | Daughton ................... 428/332 |
| 6,178,074 B1 | 1/2001 | Gill .......................... 360/324.2 |
| 6,185,080 B1 | 2/2001 | Gill .......................... 360/324.2 |

(List continued on next page.)

FOREIGN PATENT DOCUMENTS

| | | |
|---|---|---|
| EP | 0 971 423 A1 | 1/2000 |
| JP | 9-92905 | 4/1997 |
| JP | 2000 276720 | 10/2000 |
| JP | 2001 156358 | 6/2001 |
| WO | WO 00/19226 | 4/2000 |
| WO | WO 01/23903 A1 | 4/2001 |

OTHER PUBLICATIONS

Zhu, Spin Valve and Dual Spin Valve Heads With Synthetic Antiferromagnets, IEEE Transactions on Magnetics, vol. 35, No. 2, Mar. 1999, pp. 655–650.

Nagasaka et al., Giant Magnetroresistance Properties of Specular Spin Valve Films in a Current Perpendicular to Plane Structure, Journal of Applied Physics, vol. 89, No. 11, Jun. 1, 2001, 6943–69–45.

"Signal Asymmetry Control for GMR Heads," Research Disclosure 432113, 4/00, p. 745.

"Method to Obtain Uniform Composition Across Wafers," Research Disclosure 432122, 4/00, p. 747.

Nagasaka et al., Giant Magnetoresistance Properties of Spin Valve Films in Current–Perpendicular–to–Plane Geometry, Journal of Magnetics Society of Japan, vol. 25, No. 4, 807–810.

Primary Examiner—Jefferson Evans
(74) Attorney, Agent, or Firm—Crawford Maunu PLLC

(57) ABSTRACT

A Giant Magneto-Resistive (GMR) sensor (800) provides increased GMR effect through the use of composite laminate structure (870) as the second of two self-pinned layers of Anti-Parallel (AP) self-pinned layer 865. A positive magnetostrictive material forms the embedded layer (820) of AP pinned layer (865) to increase the perpendicular to Air Bearing Surface (ABS) intrinsic anisotropy field ($H_k$). The embedded layer (820) of AP pinned layer (865) has no effect on the GMR stack texture, since outer ferromagnetic layers (815 and 825) are provided to control the GMR stack texture.

21 Claims, 7 Drawing Sheets

U.S. PATENT DOCUMENTS

| | | |
|---|---|---|
| 6,219,208 B1 | 4/2001 | Gill .......................... 360/324.1 |
| 6,243,288 B1 | 6/2001 | Ishikawa et al. ............. 365/158 |
| 6,252,796 B1 | 6/2001 | Lenssen et al. ............. 365/173 |
| 6,271,997 B1 | 8/2001 | Gill ............................ 360/314 |
| 6,275,363 B1 | 8/2001 | Gill ......................... 360/324.2 |
| 6,295,187 B1 * | 9/2001 | Pinarbasi ............... 360/324.11 |
| 6,317,297 B1 | 11/2001 | Tong et al. ................. 360/314 |
| 6,327,122 B1 | 12/2001 | Pinarbasi ............... 360/324.11 |
| 6,549,383 B1 * | 4/2003 | Gill ....................... 360/324.11 |
| 6,624,985 B1 * | 9/2003 | Freitag et al. ........... 360/324.1 |
| 2001/0006443 A1 | 7/2001 | Maruyama et al. |
| 2001/0026470 A1 | 10/2001 | Gillies et al. |
| 2001/0030839 A1 | 10/2001 | Zhong et al. |
| 2001/0030842 A1 | 10/2001 | Pinarbasi |
| 2002/0181169 A1 * | 12/2002 | Pinarbasi ............... 360/324.11 |
| 2003/0016475 A1 * | 1/2003 | Hoshiya et al. .......... 360/324.1 |
| 2003/0179516 A1 * | 9/2003 | Freitag et al. ......... 360/324.11 |

* cited by examiner

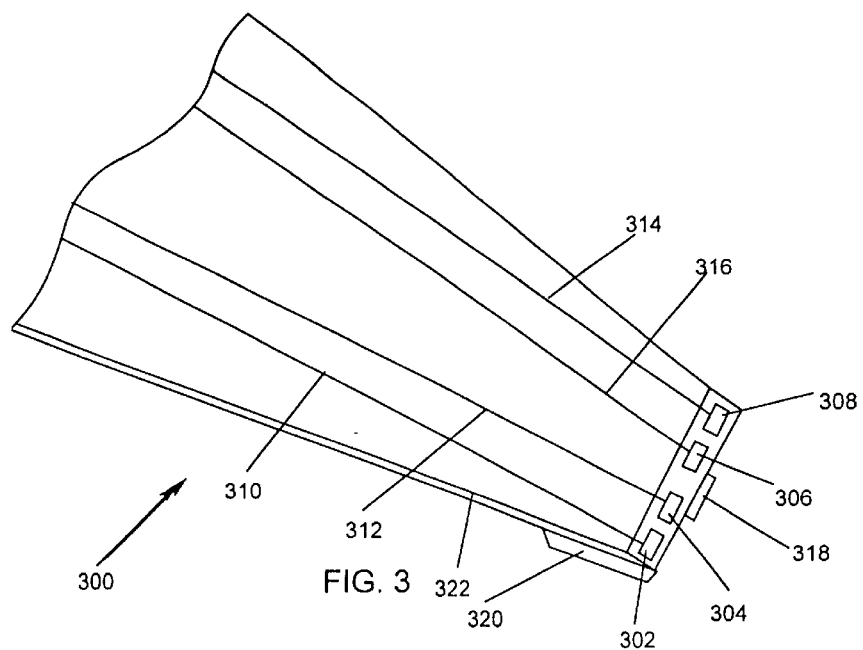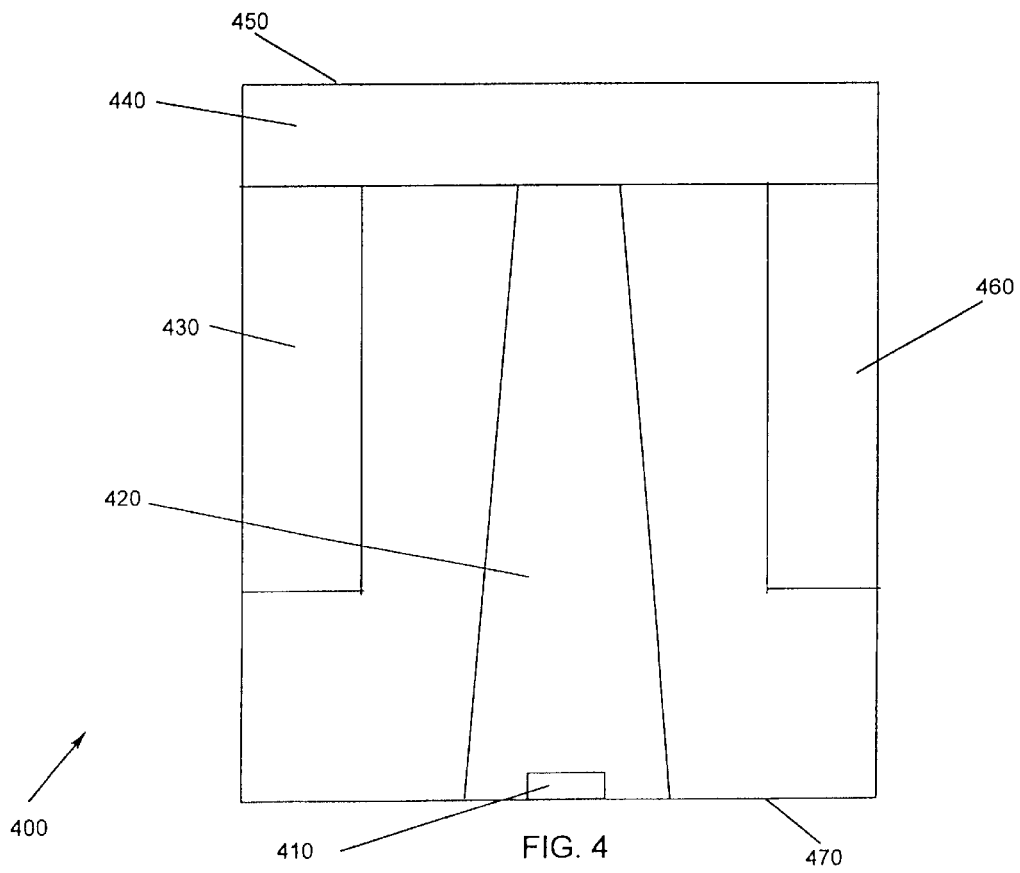

METHOD AND APPARATUS FOR IMPROVED PINNING STRENGTH FOR SELF-PINNED GIANT MAGNETORESISTIVE HEADS

BACKGROUND OF THE INVENTION

1. Field of the Invention

This invention relates in general to spin valve heads for magnetic storage systems, and more particularly to a method and apparatus for enhanced giant magnetoresistance (GMR) effects using positive magnetostrictive material embedded in a self-pinned composite layer.

2. Description of Related Art

Magnetic recording is a key and invaluable segment of the information-processing industry. While the basic principles are one hundred years old for early tape devices, and over forty years old for magnetic hard disk drives, an influx of technical innovations continues to extend the storage capacity and performance of magnetic recording products. For hard disk drives, the areal density or density of written data bits on the magnetic medium has increased by a factor of more than two million since the first disk drive was applied to data storage. Since 1991, areal density has grown by a 60% compound growth rate, which is based on corresponding improvements in heads, media, drive electronics, and mechanics.

Magnetic recording heads have been considered the most significant factor in areal-density growth. The ability of the magnetic recording heads to both write and subsequently read magnetically recorded data from the medium at data densities well into the Gigabits per Square Inch ($Gbits/in^2$) range gives hard disk drives the power to remain the dominant storage device for many years to come.

Important components of computing platforms are mass storage devices including magnetic disk and magnetic tape drives, where magnetic tape drives are popular, for example, in data backup applications. The magnetic disk drive includes a rotating magnetic disk, write and read heads that are suspended by a suspension arm above the rotating magnetic disk and an actuator that swings the suspension arm to place the read and write heads over selected circular tracks on the rotating disk. The read and write heads are directly mounted on a slider that has an Air-Bearing Surface (ABS) between the slider and the rotating disk. The suspension arm biases the slider into contact with the surface of the magnetic disk when the magnetic disk is not rotating. However, when the magnetic disk rotates, air is swirled by the rotating disk adjacent to the ABS causing the slider to ride on a cushion of air just above the surface of the rotating magnetic disk. The write and read heads are employed for writing magnetic data to and reading magnetic data from the rotating disk. The read and write heads are connected to processing circuitry that operates according to a computer program to implement the writing and reading functions.

A magnetoresistive (MR) sensor detects magnetic field signals through the resistance changes of a sensing element as a function of the strength and direction of magnetic flux being sensed by the sensing element. Conventional MR sensors, such as those used as MR read heads for reading data in magnetic recording disk and tape drives, operate on the basis of the anisotropic magnetoresistive (AMR) effect of the bulk magnetic material, which is typically a perm-alloy. A component of the read element resistance varies as the square of the cosine of the angle between the magnetization direction in the read element and the direction of sense current through the read element. Recorded data can be read from a magnetic medium, such as the magnetic disk in a magnetic disk drive, because the external magnetic field from the recorded magnetic medium (the signal field) causes a change in the direction of magnetization in the read element, which in turn causes a change in resistance of the read element and a corresponding change in the sensed current or voltage.

In the past several years, prospects of increased storage capacity have been made possible by the discovery and development of sensors based on the giant magnetoresistance (GMR) effect, also known as the spin-valve effect. In the spin valve sensor, the GMR effect varies as the cosine of the angle between the magnetization of the pinned layer and the magnetization of the free layer. Recorded data can be read from a magnetic medium because the external magnetic field from the recorded magnetic medium, or signal field, causes a change in the direction of magnetization of the free layer, which in turn causes a change in the resistance of the spin valve sensor and a corresponding change in the sensed current or voltage.

Magnetic sensors utilizing the GMR effect are found in mass storage devices such as, for example, magnetic disk and tape drives and are frequently referred to as spin-valve sensors. The spin-valve sensors being divided into two main categories, the Anti-FerroMagnetically (AFM) pinned spin valve and the self-pinned spin valve. An AFM pinned spin valve comprises a sandwiched structure consisting of two ferromagnetic layers separated by a thin non-ferromagnetic layer. One of the ferromagnetic layers is called the pinned layer because it is magnetically pinned or oriented in a fixed and unchanging direction by an adjacent AFM layer, commonly referred to as the pinning layer, which pins the magnetic orientation of the pinned layer through anti-ferromagnetic exchange coupling by the application of a sense current field. The other ferromagnetic layer is called the free or sensing layer because the magnetization is allowed to rotate in response to the presence of external magnetic fields.

In the self-pinned spin valve, the magnetic moment of the pinned layer is pinned in the fabrication process, i.e.—the magnetic moment is set by the specific thickness and composition of the film. The self-pinned layer may be formed of a single layer of a single material or may be a composite layer structure of multiple materials. It is noteworthy that a self-pinned spin valve requires no additional external layers applied adjacent thereto to maintain a desired magnetic orientation and, therefore, is considered to be an improvement over the anti-ferromagnetically pinned spin valve.

In spin valve sensors that provide exchange coupling with an AFM layer, several problems exist. The exchange field strength, for example, of a Fe—Mn AFM pinning layer is highly sensitive to temperature. As the temperature increases, the Fe—Mn pinning layer is said to soften, whereby the Fe—Mn pinning layer's ability to fix the magnetization of the ferromagnetic pinned layer decreases. Thus, any Electro-Static Discharge (ESD) event, which causes an increase in temperature, may reduce the pinning capability of the Fe—Mn pinning layer.

Additionally, the use of Fe—Mn requires careful control of the fabrication process steps and the use of protective materials as Fe—Mn is highly susceptible to corrosion. Further, the use of Fe—Mn also requires that the anti-ferromagnetic material used to exchange bias the free ferromagnetic layer be made of a different material, such as Ni—Mn. To provide sufficient exchange coupling field strength, however, the Ni—Mn must be annealed, which may cause interdiffusion of other materials into the free layer causing decreased magnetoresistance and other detrimental effects.

Prior art self-pinned spin valves, seeking to eliminate the problems of the AFM exchange coupled spin valves, provide an Anti-Parallel (AP) laminate structure consisting of first and second Ferromagnetic Pinned (FP) layers separated by an Anti-Ferromagnetic Coupling (APC) layer. The magnetic orientations of the first and second FP layers are set to be in opposite directions and the thickness of the FP layers is such that the net magnetic moment of the laminated structure is near zero. In order for the intrinsic anisotropy field ($H_k$) of the AP laminate structure to remain self-pinned, the magnitude of $H_k$ must be several times larger than the coupling field of the free layer. Depending upon the materials used for the FP and APC layers of the prior art, a preferred minimum thickness of the APC layer is desired in order to strengthen the anti-ferromagnetic coupling between the AP layers. The thickness of the APC layer may be made so thin, however, that pin holes are introduced into the APC layer, which affect the coupling strength of the APC layer.

It can be seen therefore, that there is a need for an improved, self-pinning spin valve structure which eliminates the problems of the AFM exchange coupled spin valves and also increases the pinning strength of the AP laminate structure of the prior art without the necessity of adjusting the thickness of the APC layer.

SUMMARY OF THE INVENTION

To overcome the limitations in the prior art described above, and to overcome other limitations that will become apparent upon reading and understanding the present specification, the present invention discloses a method and apparatus for increased pinning strength of an AP layer through the use of an embedded, positive magnetostrictive material between outer layers of ferromagnetic material. The present invention increases the pinning strength of the self-pinned AP layer by increasing the perpendicular to ABS $H_k$, which enhances both the intrinsic and the stress induced uniaxial anisotropy field.

A method in accordance with the principles of the present invention includes forming a first pinned layer having a first magnetic orientation on a substrate. The method of forming the first pinned layer includes embedding an inner ferromagnetic layer between first and second ferromagnetic layers. The inner layer providing a greater positive magnetostrictive coefficient in relation to the first and second ferromagnetic layers. The method further comprises depositing a second pinned layer having a second magnetic orientation above the first pinned layer. The first and second magnetic orientations are self-biased anti-parallel in relation to one another.

In another embodiment of the present invention, a spin valve sensor is provided. The spin valve sensor includes a first pinned layer having a first magnetic orientation. The first pinned layer including a first ferromagnetic layer, a second ferromagnetic layer disposed above the first ferromagnetic layer, and an inner ferromagnetic layer embedded between the first and second ferromagnetic layers. The inner ferromagnetic layer having a greater positive magnetostrictive coefficient in relation to the first and second ferromagnetic layers. The spin valve sensor further comprises a second pinned layer having a second magnetic orientation. The first and second magnetic orientations are self-biased anti-parallel in relation to one another.

In another embodiment of the present invention, a magnetic storage system is provided. The magnetic storage system includes a magnetic recording medium and a spin valve sensor disposed proximate to the recording medium. The spin valve sensor comprises a first pinned layer having a first magnetic orientation. The first pinned layer including a first ferromagnetic layer, a second ferromagnetic layer disposed above the first ferromagnetic layer, and an inner ferromagnetic layer embedded between the first and second ferromagnetic layers. The inner ferromagnetic layer having a greater positive magnetostrictive coefficient in relation to the first and second ferromagnetic layers. The magnetic storage system further comprises a second pinned layer having a second magnetic orientation. The first and second magnetic orientations are self-biased anti-parallel in relation to one another.

These and various other advantages and features of novelty which characterize the invention are pointed out with particularity to the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout:

FIG. 3 illustrates a slider mounted on a suspension;

FIG. 4 illustrates an ABS view of the slider and the magnetic head;

DETAILED DESCRIPTION OF THE INVENTION

In the following description of the exemplary embodiment, reference is made to the accompanying drawings which form a part hereof, and in which is shown by way of illustration the specific embodiments in which the invention may be practiced. It is to be understood that other embodiments may be utilized as structural changes may be made without departing from the scope of the present invention.

The present invention provides a method and apparatus for improving the GMR effects of a spin valve sensor, which utilizes a self-pinned composite layer. The present invention solves the above-described problems of the prior art by forming a first pinned layer with a composite material achieving high pinning strength through an increase in a perpendicular to ABS $H_k$. The increase in $H_k$ is facilitated by the use of a positive magnetostrictive material sandwiched between two composite layers. The positive magnetostrictive material being embedded within the two composite layers to avoid any impact of the positive magnetostrictive material on the texture of the GMR stack. In addition, experimental findings show that the composite layer structure of the first pinned layer provides improved, i.e.—higher, thermal stability.

Figure 1:
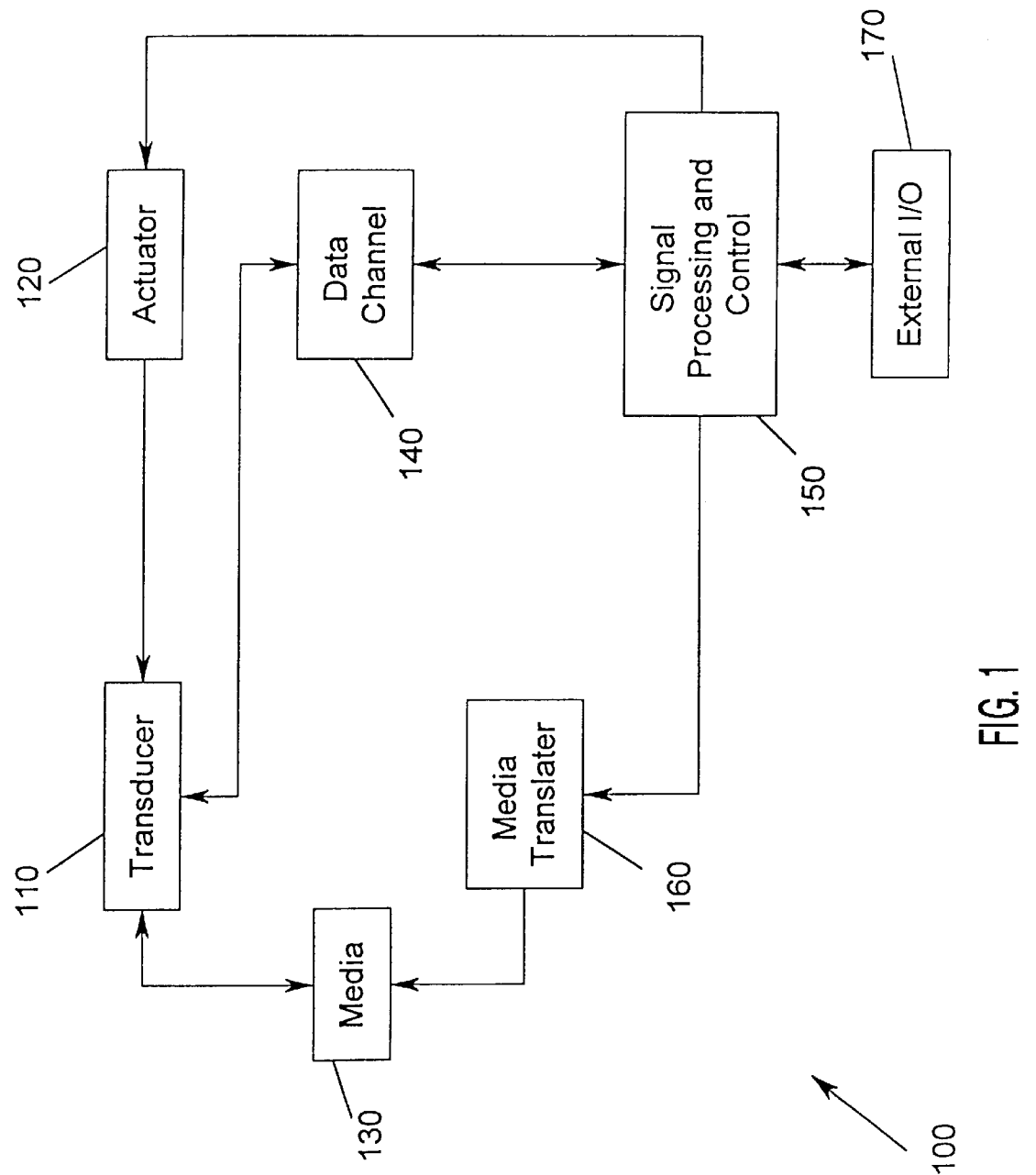
FIG. 1 illustrates a storage system according to the present invention.

FIG. 1 illustrates an exemplary storage system 100 according to the present invention. A transducer 110 is under control of an actuator 120, whereby the actuator 120 controls the position of the transducer 110. The transducer 110 writes and reads data on magnetic media 130. The read/write signals are passed to a data channel 140. A signal processor 150 controls the actuator 120 and processes the signals of the data channel 140 for data exchange with external Input/Output (I/O) 170. I/O 170 may provide, for example, data and control conduits for a desktop computing application which utilizes storage system 100. In addition, a media translator 160 is controlled by the signal processor 150 to cause the magnetic media 130 to move relative to the transducer 110. The present invention is not meant to be limited to a particular type of storage system 100 or to the type of media 130 used in the storage system 100.

Figure 2:
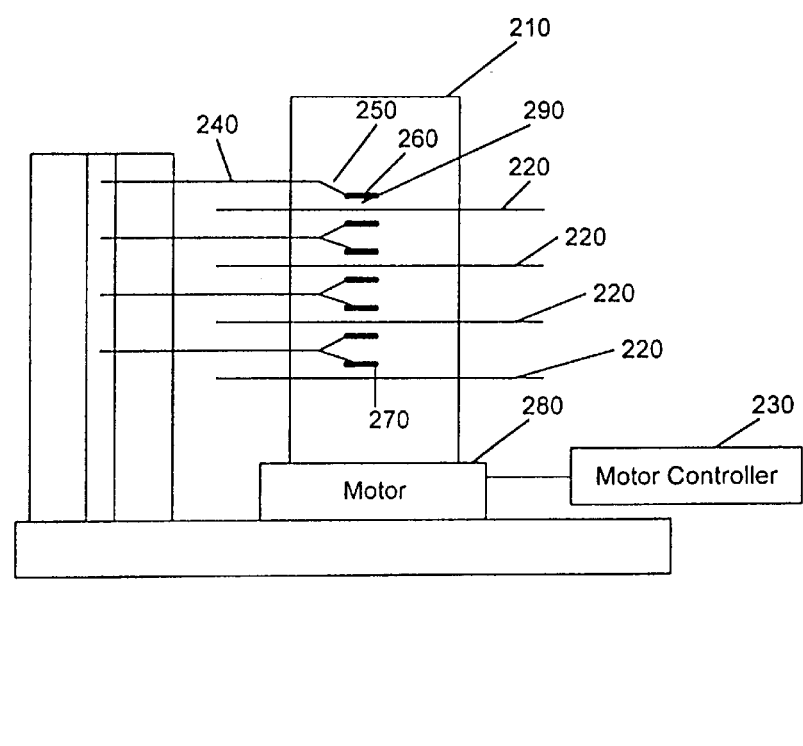
FIG. 2 illustrates one particular embodiment of a storage system according to the present invention.

FIG. 2 illustrates one particular embodiment of a multiple magnetic disk storage system 200 according to the present invention. In FIG. 2, a hard disk drive storage system 200 is shown. The system 200 includes a spindle 210 that supports and rotates multiple magnetic disks 220. The spindle 210 is rotated by motor 280 that is controlled by motor controller 230. A combined read and write magnetic head 270 is mounted on slider 260 that is supported by suspension 250 and actuator arm 240. Processing circuitry exchanges signals that represent information with read/write magnetic head 270, provides motor drive signals for rotating the magnetic disks 220, and provides control signals for moving the slider 260 to various tracks. Although a multiple magnetic disk storage system is illustrated, a single magnetic disk storage system is equally viable in accordance with the present invention.

The suspension 250 and actuator arm 240 position the slider 260 so that read/write magnetic head 270 is in a transducing relationship with a surface of magnetic disk 220. When the magnetic disk 220 is rotated by motor 280, the slider 240 is supported on a thin cushion of air (air bearing) between the surface of disk 220 and the ABS 290. Read/write magnetic head 270 may then be employed for writing information to multiple circular tracks on the surface of magnetic disk 220, as well as for reading information therefrom.

FIG. 3 illustrates a slider 320 mounted on a suspension 322. First and second solder connections 302 and 308 connect leads from the sensor 318 to leads 310 and 314, respectively, on suspension 322 and third and fourth solder connections 304 and 306 connect to the write coil (not shown) to leads 312 and 316, respectively, on suspension 322.

FIG. 4 is an ABS view of slider 400 and magnetic head 410. The slider has a center rail 420 that supports the magnetic head 410, and side rails 430 and 460. The support rails 420, 430 and 460 extend from a cross rail 440. With respect to rotation of a magnetic disk, the cross rail 440 is at a leading edge 450 of slider 400 and the magnetic head 410 is at a trailing edge 470 of slider 400.

The above description of a typical magnetic recording disk drive system, shown in the accompanying FIGS. 1–4, are for presentation purposes only. Disk drives may contain a large number of disks and actuators, and each actuator may support a number of sliders. In addition, instead of an air-bearing slider, the head carrier may be one which maintains the head in contact or near contact with the disk, such as in liquid bearing and other contact and near-contact recording disk drives.

Figure 5:
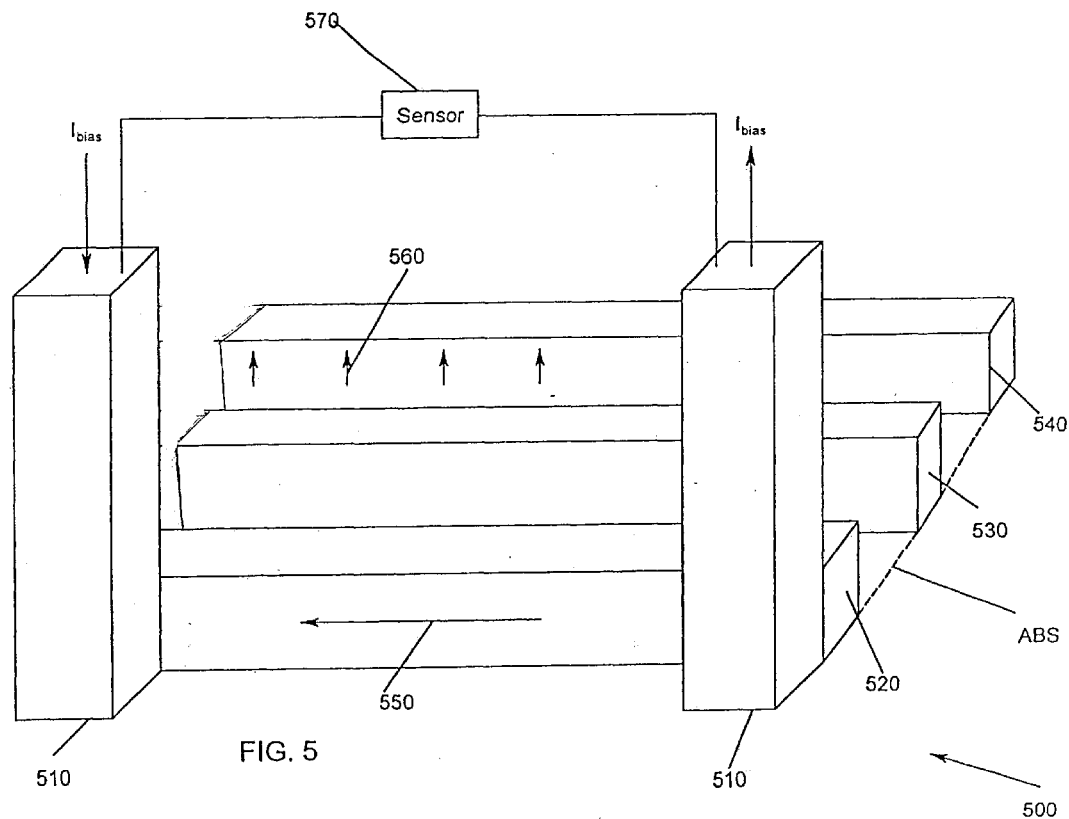
FIG. 5 illustrates a basic GMR structure and the relative magnetic orientations.

FIG. 5 illustrates an exemplary diagram of a simple GMR sensor 500 having an ABS as shown. Contacts 510 accept $I_{bias}$ current bias as shown from a current source (not shown). Free layer 520, conducting spacer 530 and pinned layer 540 are arranged adjacent to each other as shown, each having a first surface exposed to the ABS. GMR sensor 500 maintains magnetic orientation 560 of pinned layer 540 to be perpendicular to the ABS. As stated above, the magnetic orientation 560 of pinned layer 540 may be maintained either by an AFM layer through exchange coupling or through a self-pinning structure. Self-pinning structures are the only structures to be considered hereinafter.

In the quiescent state, i.e.—no signal field present, GMR sensor 500 maintains magnetic orientation 550 of free layer 520 to be perpendicular to magnetic orientation 560 of pinned layer 540. Sensor 570 reads a nominal voltage value for GMR sensor 500 due to the product of $I_{bias}$ and the quiescent resistance value of GMR sensor 500. The self-pinning field of pinned layer 540 should be greater than any demagnetizing fields at the operating temperature of GMR sensor 500, in order to insure that the magnetization direction 560 of pinned layer 540 remains fixed during the application of the external signal field induced by data bits recorded on the magnetic media (not shown).

The magnetization of free layer 550 is not fixed and is free to rotate in response to the external signal field induced by data bits recorded on the magnetic media (not shown). In GMR sensor 500, the GMR resistance change effect varies as the cosine of the angle between magnetization 560 of pinned layer 540 and magnetization 550 of free layer 520. Recorded data can be read from a magnetic medium because the external magnetic field, or signal field, induced by the recorded data bits are effective to change the orientation of magnetization 550 of free layer 520, thereby changing the resistance of GMR sensor 500, which results in a corresponding voltage change detected by sensor 570.

Figure 6:
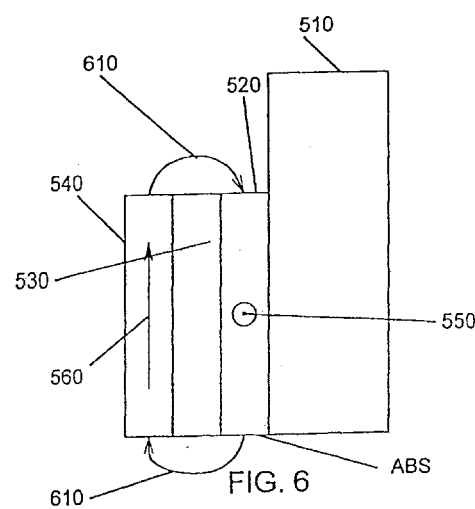
FIG. 6 illustrates a side view of the GMR structure of FIG. 5.

FIG. 6 illustrates a side view of GMR sensor 500 under quiescent conditions. Magnetization orientation 550 of free layer 520 is out of the plane of the page, which is perpendicular to magnetic orientation 560 of pinned layer 540. In the absence of a signal field, the magnetic orientation 550 of free layer 520 spontaneously magnetizes itself along the long axis of free layer 520, which is parallel to the ABS, resulting in a nominal resistance of GMR sensor 500. In the presence of a signal field, magnetic orientation 550 rotates from a parallel to a perpendicular orientation with respect to the ABS. As the magnetic orientation 550 rotates, the resistance value of GMR sensor 500 changes from a minimum resistance corresponding to a parallel relationship of magnetic orientation 550 with magnetic orientation 560 of pinned layer 540 to a maximum resistance corresponding to an anti-parallel relationship of magnetic orientation 550 with magnetic orientation 560.

A key requirement of GMR sensor 500 for optimal operation is that pinned layer 540 should be magnetically saturated perpendicular to the ABS. Lack of saturation in pinned layer 540 leads to reduced signal or dynamic range. Factors leading to a loss of saturation include demagnetizing fields at the edge of pinned layer 540, transverse magnetic fields caused by recorded data bits and from longitudinal biasing regions, current induced fields and the coupling field to free layer 520.

Figure 6A:
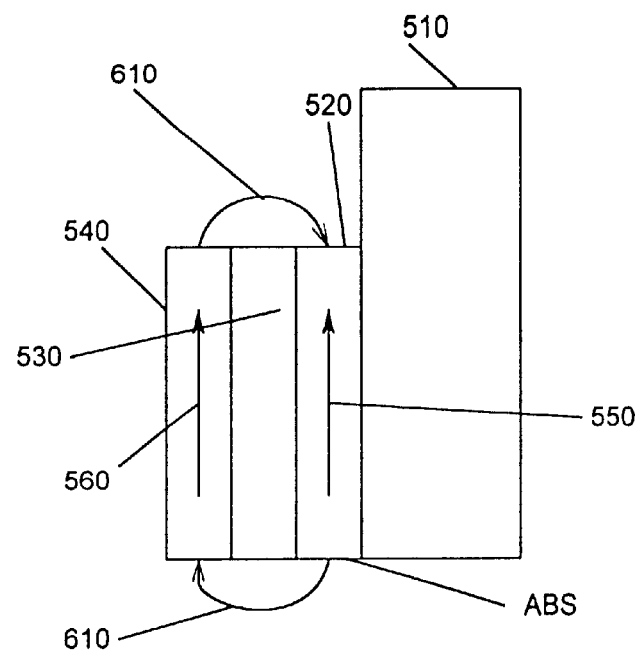
FIG. 6a illustrates a minimum resistivity GMR sensor and the associated magnetic orientation of the pinned and free layers.
Figure 6B:
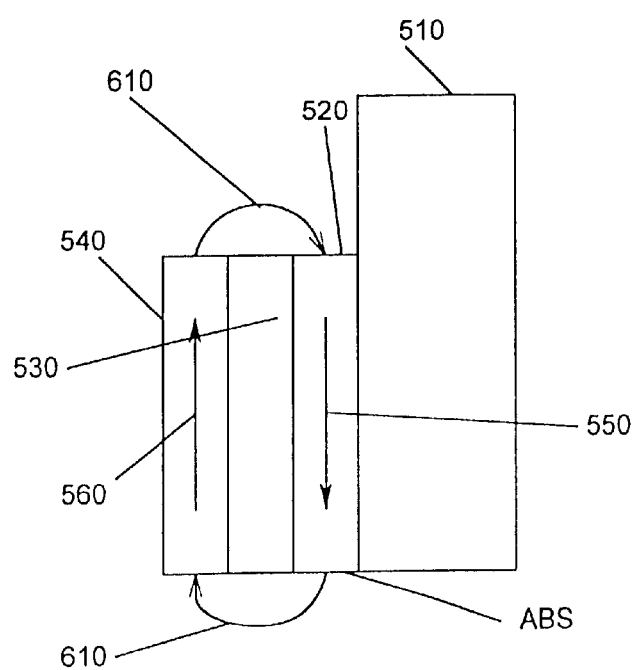
FIG. 6b illustrates a maximum resistivity GMR sensor and the associated magnetic orientation of the pinned and free layers.

Turning to FIG. 6a, magnetic orientation 550 of free layer 520 is shown to be parallel with magnetic orientation 560 of pinned layer 540, thus illustrating the magnetic orientations having the minimum resistance configuration. The minimum resistance configuration established when a transverse magnetic field caused by a recorded bit on a magnetic medium (not shown) passes underneath sensing, or free, layer 520. As the recorded bit (not shown) moves further away from sensing layer 520, magnetic orientation 550 fully deflects in an anti-parallel relationship to magnetic orientation 560, as shown if FIG. 6b. As can be seen from FIGS. 6a and 6b, any deviation of magnetic orientation 560 of pinned layer 540 from being perpendicular to ABS results in a reduction in the dynamic range of the GMR effect of GMR sensor 500, since the deviation would cause the relative magnetic orientations 550 and 560 to be slightly skewed from their relative parallel and anti-parallel orientations.

Figure 7:
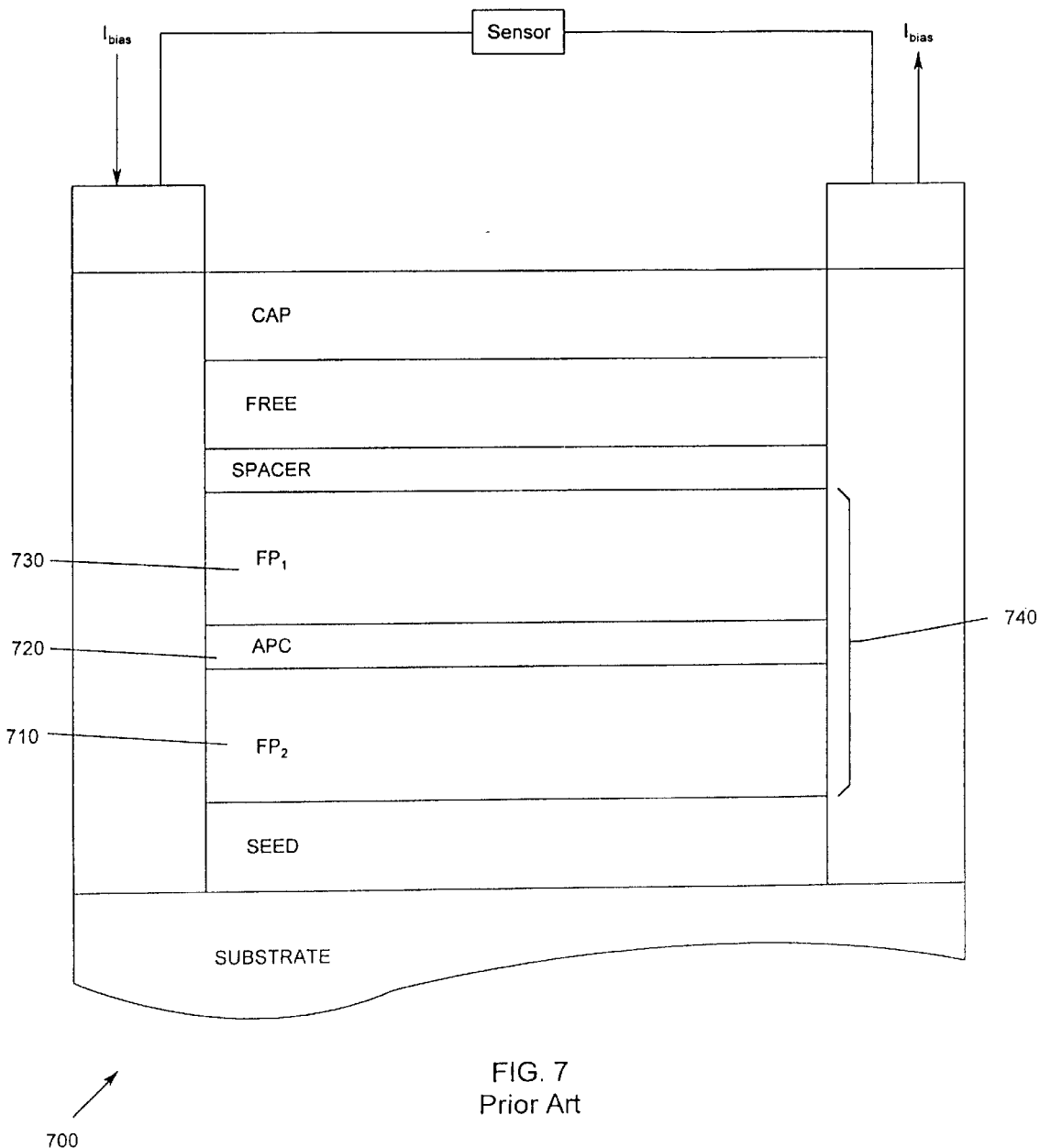
FIG. 7 illustrates a prior art GMR sensor using a self-pinned reference layer.

FIG. 7 illustrates a prior art GMR sensor 700 employing ferromagnetically pinned layers $FP_1$ 730 and $FP_2$ 710 and APC layer 720 providing the anti-parallel coupling as discussed above. $FP_1$ layer 730 of FIG. 7 is generally a single ferromagnetic layer formed of high uniaxial anisotropy material such as Co—Fe, or alternatively, a two-layer structure comprising a first ferromagnetic sublayer formed of Co in contact with the spacer layer and a second ferromagnetic sub-layer formed of a high uniaxial anisotropy material such as Co—Fe in contact with APC layer 720. Additionally, the $FP_2$ layer 710 is generally a single ferromagnetic layer formed of high uniaxial anisotropy material such as Co—Fe, or alternatively, a two-layer structure comprising a first ferromagnetic sublayer formed of Co in contact with APC layer 720 and a second ferromagnetic sub-layer formed of a high uniaxial anisotropy material such as Ni—Fe—Nb in contact with the seed layer.

Figure 8:
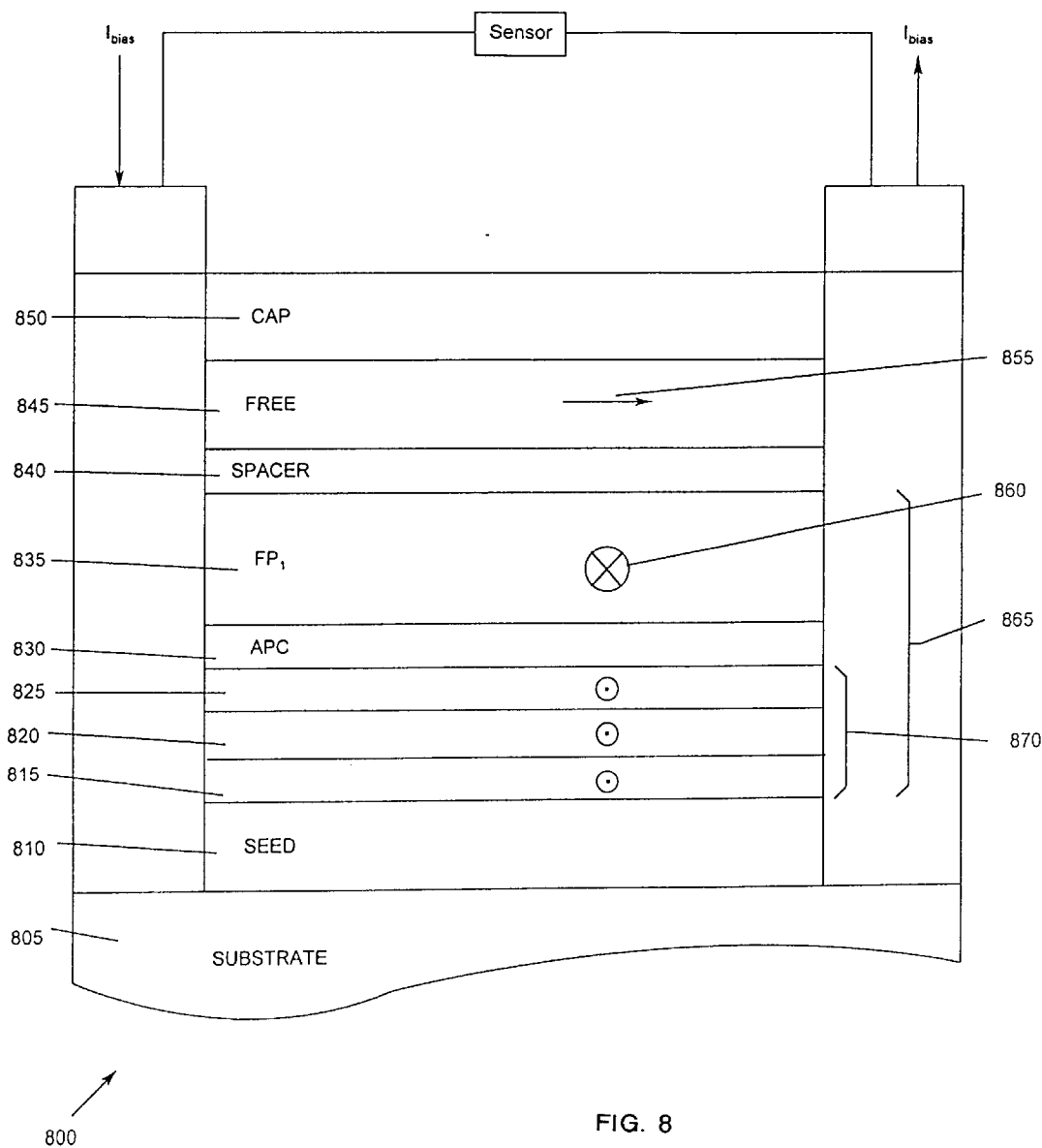
FIG. 8 illustrates a GMR sensor according to the present invention.

FIG. 8 illustrates an exemplary AP self-pinned structure for GMR sensor 800 according to the present invention. Substrate 805 may be any suitable composition including semiconductor material, glass or ceramic material such as alumina ($Al_2O_3$). GMR sensor 800 may be fabricated in a magnetron sputtering or an ion beam sputtering system to sequentially deposit the multilayer structure on substrate 805 as shown in FIG. 8.

Seed layer 810 is deposited to modify the crystallographic texture or grain size of the subsequent layers. Seed layer 810 may be, for example, comprised of a first layer of $Al_2O_3$ adjacent to substrate 805. The $Al_2O_3$ layer generally having a thickness of approximately 30 angstroms. Approximately 20 angstroms of NiFeCr and 8 angstroms of NiFe are followed by approximately 30 angstroms of PtMn to complete exemplary seed layer 810.

Second ferromagnetically pinned layer 870 is comprised of a composite laminate structure having outer layers 815 and 825 composed of approximately 5–10 angstroms of $Co_{90}$—$Fe_{10}$. Inner layer 820 is comprised of approximately 5–10 angstroms of $Co_{70}$—$Fe_{30}$. Inner layer 820 has a preferably larger Fe concentration as compared to outer layers 815 and 825. The concentration ratio of inner layer 820 may be expressed as $Co_x$—$Fe_y$ in atomic percent, where x may range from 50 to 70 percent, while y may range from 50 to 30 percent, respectively.

The $Co_x$—$Fe_y$ layer 820, having a greater positive magnetostrictive coefficient as compared to outer layers 815 and 825, is embedded within the $Co_{90}$—$Fe_{10}$ material to avoid any impact of the $Co_x$—$Fe_y$ material on the GMR stack texture. The $Co_{90}$—$Fe_{10}$/$Co_x$—$Fe_y$/$Co_{90}$—$Fe_{10}$ composite laminate structure achieves high pinning strength through an increase in the perpendicular to ABS $H_k$ due to the use of the positive magnetostrictive material $Co_{70}$—$Fe_{30}$. Other materials are possible for use in place of the $Co_{70}$—$Fe_{30}$ material such as $Ni_{45}Fe_{55}$ and $Co_{80}Sm_{20}$, where CoSm in particular, has a very large $H_k$, which is beneficial for high pinning strength.

As discussed above, high pinning strength is required to maintain the magnetic orientation 860 of first ferromagnetic pinned layer $FP_1$ 835 substantially constant while being exposed to non-magnetizing effects. Such increased pinning strength being effective to, among other features, increase the dynamic range of the GMR effect, i.e.—the magnitude of the change in resistivity, of GMR sensor 800.

APC layer 830 separates first FP layer 835 from second FP layer 870 and is comprised of approximately 8 angstroms of, for example, Ru. Spacer layer 840 is comprised, for example, of approximately 20 angstroms of Cu deposited on first FP layer 835. Spacer layer 840 is a non-magnetic, electrically conductive layer. Free layer 845 may be comprised of approximately 15 angstroms of $Co_{90}$—$Fe_{10}$ followed by approximately 15 angstroms of NiFe (not shown). Cap layer 850 formed of Ta having a thickness of approximately 40 angstroms completes the GMR structure.

The total uniaxial anisotropy field, $H_K$, of ferromagnetic materials, such as Co—Fe, is the sum of the intrinsic uniaxial anisotropy field, $H_k$, and the stress induced uniaxial anisotropy field $H_{94}$. The intrinsic uniaxial anisotropy field, $H_k$, is normally controlled by the application of a magnetic field during film growth, or by conditions of film deposition. The stress induced uniaxial anisotropy field, $H_\sigma$, is proportional to the product of the magnetostriction coefficient, $\lambda$, of the ferromagnetic material and the tensile or compressive stress, $\sigma$, applied to the material. GMR sensor 800, which may be formed on an $Al_2O_3$ substrate, provides a tensile stress in a direction perpendicular to the ABS, so that the use of high positive magnetostrictive coefficients, such as inner layer 820, result in high values of $H_\sigma$, which is one advantage provided by the present invention.

As mentioned above, the present invention provides a method and apparatus for providing enhanced giant magnetoresistance (GMR) effects by increasing the pinning strength of the self-pinned AP layers by using a positive magnetostrictive material embedded within multiple layers of ferromagnetic material.

According to the present invention, the fields of computers and magnetic data storage and recovery are improved by the formation a GMR sensor as disclosed herein. Thus, the present invention improves not only the field of GMR sensors, but the entire field of computers and magnetic data storage and retrieval.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A method of forming a spin valve sensor, comprising:
   forming a first pinned layer having a first magnetic orientation on a substrate, the method of forming the first pinned layer includes embedding an inner ferromagnetic layer between first and second ferromagnetic layers, wherein the inner layer provides a greater positive magnetostrictive coefficient in relation to the first and second ferromagnetic layers; and
   depositing a second pinned layer having a second magnetic orientation above the first pinned layer, wherein the first and second magnetic orientations are self-biased anti-parallel in relation to one another.

2. The method of claim 1, wherein the embedded inner layer is composed of a greater concentration of iron in reference to the first and second ferromagnetic layers.

3. The method of claim 2, wherein the embedded inner layer comprises a concentration of iron ranging from 30 to 50 percent.

4. The method of claim 1, wherein a thickness of the embedded layer is less than a thickness of the first and second ferromagnetic layers.

5. The method of claim 4, wherein the thickness of the embedded layer ranges from between 5 to 10 angstroms less than the thickness of the first and second ferromagnetic layers.

6. The method of claim 1 further comprising:
   depositing an anti-parallel coupling layer between the first and second pinned layers;
   depositing a conducting spacer layer above the second pinned layer; and
   depositing a free layer above the spacer layer, a magnetic orientation of the free layer being responsive to an external signal field.

7. The method of claim 6, wherein the magnetic orientation of the free layer is substantially perpendicular to the magnetic orientation of the second pinned layer in the absence of a signal field.

8. A spin valve sensor comprising:
   a first pinned layer having a first magnetic orientation, the first pinned layer comprising:
   a first ferromagnetic layer;
   a second ferromagnetic layer disposed above the first ferromagnetic layer; and
   an inner ferromagnetic layer embedded between the first and second ferromagnetic layers, the inner ferromagnetic layer having a greater positive magnetostrictive coefficient in relation to the first and second ferromagnetic layers; and
   a second pinned layer having a second magnetic orientation, wherein the first and second magnetic orientations are self-biased anti-parallel in relation to one another.

9. The spin valve sensor of claim 8, wherein the embedded inner layer is composed of a greater concentration of iron in reference to the first and second ferromagnetic layers.

10. The spin valve sensor of claim 9, wherein the embedded inner layer comprises a concentration of iron ranging from 30 to 50 percent.

11. The spin valve sensor of claim 8, wherein a thickness of the embedded layer is less than a thickness of the first and second ferromagnetic layers.

12. The spin valve sensor of claim 11, wherein the thickness of the embedded layer ranges from between 5 to 10 angstroms less than the thickness of the first and second ferromagnetic layers.

13. The spin valve sensor of claim 8 further comprising:
   an anti-parallel coupling layer deposited between the first and second pinned layers;
   a conducting spacer layer deposited above the second pinned layer; and
   a free layer deposited above the spacer layer, a magnetic orientation of the free layer being responsive to an external signal field.

14. The spin valve sensor of claim 13, wherein the magnetic orientation of the free layer is substantially perpendicular to the magnetic orientation of the second pinned layer in the absence of a signal field.

15. A magnetic storage system, comprising:
   a magnetic recording medium;
   a spin valve sensor disposed proximate to the recording medium, the spin valve sensor, comprising
   a first pinned layer having a first magnetic orientation, the first pinned layer comprising:
   a first ferromagnetic layer;
   a second ferromagnetic layer disposed above the first ferromagnetic layer; and
   an inner ferromagnetic layer embedded between the first and second ferromagnetic layers, the inner ferromagnetic layer having a greater positive magnetostrictive coefficient in relation to the first and second ferromagnetic layers; and
   a second pinned layer having a second magnetic orientation, wherein the first and second magnetic orientations are self-biased anti-parallel in relation to one another.

16. The magnetic storage system of claim 15, wherein the embedded inner layer is composed of a greater concentration of iron in reference to the first and second ferromagnetic layers.

17. The magnetic storage system of claim 16, wherein the embedded inner layer comprises a concentration of iron ranging from 30 to 50 percent.

18. The magnetic storage system of claim 15, wherein a thickness of the embedded layer is less than a thickness of the first and second ferromagnetic layers.

19. The magnetic storage system of claim 18, wherein the thickness of the embedded layer ranges from between 5 to 10 angstroms less than the thickness of the first and second ferromagnetic layers.

20. The magnetic storage system of claim 15 further comprising:
   an anti-parallel coupling layer deposited between the first and second pinned layers;
   a conducting spacer layer deposited above the second pinned layer; and
   a free layer deposited above the spacer layer, a magnetic orientation of the free layer being responsive to an external signal field.

21. The magnetic storage system of claim 20, wherein the magnetic orientation of the free layer is substantially perpendicular to the magnetic orientation of the second pinned layer in the absence of a signal field.

* * * * *

UNITED STATES PATENT AND TRADEMARK OFFICE
CERTIFICATE OF CORRECTION

PATENT NO. : 6,801,412 B2 Page 1 of 1
DATED : October 5, 2004
INVENTOR(S) : Gill It is certified that error appears in the above-identified patent and that said Letters Patent is hereby corrected as shown below:

Column 8,
Line 36, "$H_{94}$" should read -- $H_\sigma$ --.

Signed and Sealed this

Eighth Day of March, 2005

JON W. DUDAS
*Director of the United States Patent and Trademark Office*